United States Patent [19]

Dishart et al.

[11] Patent Number: 5,196,136
[45] Date of Patent: Mar. 23, 1993

[54] CLEANING COMPOSITION OF HYDROCARBON COMPONENT, SURFACTANT AND MULTIBASIC ESTER ADDITIVE

[75] Inventors: Kenneth T. Dishart, Wilmington; Harold L. Jackson, Hockessin, both of Del.; Abraham B. Cohen, deceased, late of Princeton, N.J., by Anita Cohen, executrix

[73] Assignee: E. I. Du Pont de Nemours and Company, Wilmington, Del.

[21] Appl. No.: 718,543

[22] Filed: Jun. 20, 1991

[51] Int. Cl.$^5$ .................... C11D 7/50; C23G 5/024
[52] U.S. Cl. .................................................. 252/170
[58] Field of Search ......................................... 252/170

[56] References Cited

U.S. PATENT DOCUMENTS

| | | | |
|---|---|---|---|
| 4,024,085 | 5/1977 | Kobayashi et al. | 252/170 X |
| 4,640,719 | 2/1987 | Hayes et al. | 134/40 |
| 4,867,800 | 9/1989 | Dishart et al. | 252/170 X |
| 4,886,615 | 12/1989 | Dehan | 252/170 X |
| 4,934,391 | 6/1990 | Futch et al. | 252/174.19 X |
| 4,983,224 | 1/1991 | Mombrun | 252/170 X |
| 5,011,620 | 4/1991 | Dishart et al. | 252/170 X |
| 5,062,988 | 11/1991 | Dishart et al. | 252/170 |
| 5,084,200 | 1/1992 | Dishart et al. | 252/170 X |

*Primary Examiner*—Patrick P. Garvin

[57] ABSTRACT

A cleaning composition is disclosed which is suitable for cleaning substrates and particularly for cleaning flux residues from a printed circuit board. The cleaning composition comprises a hydrocarbon component, a compatibilizing agent, a multibasic ester additive, and optionally water. The multibasic ester may be an alkanoic acid ester of a diol or polyol, an alkanoic acid ester of a hydroxy alkanoate alkyl ester, or and alkyl ester of a compound containing two or more carboxylic acid groups and one or more hydroxyl groups which are optionally esterified with an alkanoic acid group. The cleaning composition may be used as a solution or as an emulsion or dispersion to clean a substrate.

23 Claims, No Drawings

CLEANING COMPOSITION OF HYDROCARBON COMPONENT, SURFACTANT AND MULTIBASIC ESTER ADDITIVE

BACKGROUND OF THE INVENTION

The present invention relates to an environmentally safe cleaning composition and a method for removal of contaminants from a substrate surface. More particularly the present invention relates to a cleaning composition and a method for removal of solder flux from a surface of a printed circuit board.

Prior to a soldering operation for attachment of components to printed circuit boards it is conventional and essential to apply a soldering flux to insure an adherent, electrically conductive bond of solder. The printed circuit board may be protected with a solder mask which covers all areas of the substrate except where solder is to contact and adhere to a conductive surface portion. Application of flux and solder can be done by hand, wave or reflow methods. In wave soldering, the substrate is mechanically conveyed over and contacted with the flux and then with a molten solder wave. The solder adheres to all conductive surfaces on the substrate except where solder mask is present. In reflow soldering a solder paste, containing both flux and solder metal in powder form, is applied only to the points where solder bonds are to be made. Components are set in place and the entire printed circuit board assembly is heated to melt the solder. Flux which remains on the assembly after soldering can cause premature failure of the electrical circuitry through corrosion, absorption of water and other effects and must be removed.

In Hayes et al., U.S. Pat. No. 4,640,719, use of terpene compounds is disclosed in cleaning printed wiring boards. This patent discloses cleaning of residual flux and particularly rosin solder flux and adhesive tape residues employing terpene compounds such as pinene including its alpha and beta isomer, gamma terpinene, delta-3-carene, limonene and dipentene with limonene and dipentene preferred. Dipentene is the racemic mixture of the limonene optically active isomers. This patent further discloses that these terpene compounds are almost completely insoluble in water and cannot be directly flushed away by water. Therefore, in a preferred embodiment terpene compounds are combined with one or more emulsifying surfactants capable of emulsifying terpenes with water to facilitate their removal.

Dishart et al., U.S. Pat. No. 4,867,800 discloses cleaning of printed circuit board substrates with a combination of a dibasic ester and terpene.

Futch et al., U.S. Pat. No. 4,934,391 discloses removal of rosin solder flux or resist residues employing a dibasic ester and an emulsifying surfactant. In a distinct embodiment, a combination of terpenes and dibasic esters are disclosed.

With the advent of tightened restrictions on the use of CFCs and chlorocarbon solvents, metal fabricators and other manufacturers are faced with a choice among many options for satisfying their cleaning requirements. These include flammable alcohols, high-flash-point solvents, semi-aqueous cleaners based on terpenes or terpenes/dibasic esters, and aqueous cleaners. Alcohols clean well but are flammable, high-flash-point solvents leave residues which are slow drying, terpenes have undesirably low flash points and objectionable odors, dibasic esters are too aggressive for many electronics applications and sometimes attack components, and aqueous cleaners are ineffective for removing heavy oils and greases from tight clearances.

SUMMARY OF THE INVENTION

The present invention is directed to a cleaning composition suitable for cleaning a substrate which comprises:
(a) a hydrocarbon component;
(b) a multiple ester additive having the formula:

$(RO)_m\text{-}A\text{-}(CO_2R')_n$ wherein A is a linear, branched or cyclic alkane having 1 to 20 carbon atoms, or a di, tri, or tetra alkylene glycol wherein the alkylene contains 2 or 3 carbon atoms; m is an integer 1 to 6 and n is 0 or an integer 1 to 6; wherein when n is 0, then m is 2 to 6 and R is hydrogen or a linear, branched or cyclic alkyl carbonyl group having 1 to 20 carbon atoms; and when n is 1 to 6 and m is 1 to 6, then R' is a linear, branched or cyclic alkyl group having 1 to 20 carbon atoms; and then R is hydrogen or a linear, branched or cyclic alkyl carbonyl group having 1 to 20 carbon atoms; wherein the multiple ester additive contains at least two ester groups;
(c) a compatibilizing agent for the combination of (a) and (b).

Superior results have been obtained if additionally the composition further contains
(d) a small amount of water such as up to 2% by weight water based on components (a), (b), (c) and (d).

The present invention is also directed to a water emulsion or dispersion of the cleaning composition wherein the emulsion or dispersion may contain up to about 95 percent by weight of water.

The present invention is further directed to the use of such cleaning compositions, emulsions or dispersions in reducing residues on a surface of a substrate such as a metal or plastic substrate and particularly a printed circuit board.

DETAILED DESCRIPTION OF THE INVENTION

The cleaning composition of the present invention can be employed upon any substrate surface particularly one to which residual excess flux is present such as after a soldering operation. A preferred substrate surface is a printed circuit board surface which may or may not be protected by a solder mask permanent coating in areas where solder is not to adhere. In the present disclosure printed circuit board is employed in a generic sense and is inclusive of printed wiring boards and the term "multibasic ester" is synonymous with the term "multiple ester".

In the present invention a combination of a hydrocarbon component, a compatibilizing agent and a multiple ester additive is considered to be a replacement over the use of chlorofluorocarbon (CFC) solvents which are presently employed as cleaning agents with particular suitability in cleaning printed circuit boards. Optionally the cleaning composition is a preferred mode for cleaning printed circuit boards additionally contains up to about 2% by weight of water based on the components of hydrocarbon, compatibilizing agent, multiple ester and water. An azeotrope of trichlorotrifluoroethane and methanol such as sold under the trademark Freon ® TMS by E. I. du Pont de Nemours and Company is superior to known methods of cleaning solder flux from a surface of a printed wiring board. However, the use of fully halogenated clorofluorocarbon materials are considered to present a threat to the environment because of their involvement in stratospheric ozone depletion. Therefore any improvement in alternative cleaning compositions which do not contain a fully halogenated CFC is considered significant. In accordance with the present invention, residual ionic contaminants are reduced to low levels which are even lower levels than achieved with conventional fully halogenated CFC solvent/methanol azeotrope.

In accordance with the present invention, a multiple ester additive is used in combination with a hydrocarbon component and a compatibilizing agent.

The multiple ester additive is an alkanoic acid ester of a diol, triol or polyol compound, or an alkyl ester of a compound containing at least one carboxylic acid group and at least one hydroxyl group wherein the hydroxyl group is optionally esterified with a second alkanoic acid. In the instance wherein the compound contains only one carboxylic acid group, the compound will contain one or more hydroxyl groups wherein at least one hydroxyl group is esterified with a second alkanoic acid. Thus the multiple ester additive used in this invention can be expressed by the formula:

$$(RO)_m\text{-}A\text{-}(CO_2R')_n$$

wherein A is a linear, branched or cyclic alkane having 1 to 20 carbon atoms, or a di, tri, or tetra alkylene glycol wherein the alkylene contains 2 or 3 carbon atoms; m is an integer 1 to 6 and n is 0 or an integer 1 to 6; wherein when n is 0, then m is 2 to 6 and R is hydrogen or a linear, branched or cyclic alkyl carbonyl group having 1 to 20 carbon atoms; and when n is 1 to 6 and m is 1 to 6, then R' is a linear, branched or cyclic alkyl group having 1 to 20 carbon atoms; and then R is hydrogen or a linear, branched or cyclic alkyl carbonyl group having 1 to 20 carbon atoms; wherein the multiple ester additive contains at least two ester groups. The multiple ester additive may be a single multiple ester compound or a mixture of such multiple ester compounds or types of compounds.

A type of multiple ester additive is an alkanoic acid ester of a diol or triol compound. In this type of additive, RO- typically is the residue of an alkanoic acid taken from the group consisting of formic acid, acetic acid, propionic acid, butyric acid, valeric acid and caproic acid; and -A- typically is the residue of a diol or triol compound taken from the group consisting of 1,2-ethanediol, 1,2-propanediol, 1,4-butanediol, 1,5-pentanediol, 1,6-hexanediol, triethylene glycol, tetraethylene glycol, dipropylene glycol, tripropylene glycol; and glycerine. Preferred additives of this type are propyleneglycol diisobutyrate, propyleneglycol divalerate, and diethyleneglycol diisobutyrate.

A second type of multiple ester additive useful in this invention is an alkanoic acid ester of a hydroxy alkanoate alkyl ester. In this type of additive, there may be 1, 2, or 3 RO-s wherein at least one RO- typically is the residue of an alkanoic acid taken from the group consisting of acetic acid, propionic acid, butyric acid, valeric acid and caproic acid, and the remaining RO-s may be hydroxy; and -A—CO$_2$R' typically is the residue of a hydroxy alkanoate alkyl ester taken from the group consisting of hydroxy acetate (glycollate) hydroxy propionate (lactate), hydroxy butyrate, hydroxy valerate and hydroxy caproate alkyl esters, wherein the alkyl is a linear, branched or cyclic aliphatic group having 1 to 20 carbon atoms. Preferred additives of this type are glycollate esters such as n-butylbutyryl glycollate, lactate esters such as n-butylbutyryl lactate and the like.

A third type of multiple ester additive useful in this invention is an alkyl ester of a compound containing at least two carboxylic acid groups and at least one hydroxyl group wherein the hydroxyl group is optionally esterified with a second alkanoic acid. In this type of additive, -A- typically is the residue of propane or butane; RO- typically is hydroxy or the residue of an alkanoic acid taken from the group consisting of formic acid acetic acid, propionic acid, butyric acid, valeric acid and caproic acid; and at least two —CO$_2$R's wherein the alkyl R' is a linear, branched or cyclic aliphatic group having 1 to 20 carbon atoms. Preferred additives of this type are citrate and tartrate esters.

In the present invention, a hydrocarbon component is used in combination with a multiple ester additive and a compatibilizing agent. The type of hydrocarbon useful in the invention may be selected from a broad class of aliphatic and aromatic solvents. Preferred hydrocarbon compounds or blends thereof are not classified as flammable liquids (Flash Point at or above 100° F. by Tag Closed Cup method) and they have solubility parameter ranges for, nonpolar of 6.5 to 10.5, for polar of 0 to 2.5 and hydrocarbon bonding of 0 to 2.5 based on the three dimensional Hansen Solubility Parameter System with units of the square root of calories per cubic centimeter. More preferred are the above hydrocarbon compounds or blends thereof with Flash Points above 140° F. and preferably above 200° F. Particularly preferred are aliphatic hydrocarbon liquids wherein the aliphatic hydrocarbon liquid consists of cycloparaffins, isoparaffins, n-paraffins or mixtures thereof. Examples of such hydrocarbon components are the high flash point mineral spirits and naphthas readily available from a variety of suppliers. Specific examples are Exxon "Isopar", Shell "Soltrol", Ashland "Hi-Sol" and Conoco "Conosol" solvents. In the present disclosure the use of the term "hydrocarbon solvent" expressly excludes a terpene hydrocarbon.

In the present invention, a compatibilizing agent is used in combination with a multiple ester additive and a hydrocarbon component. The compatibilizing agent is used to improve overall mutual compatibility of the blend, i.e., the mutual solubility of the multiple ester additive and the hydrocarbon component. A preferred compatibilizing agent is a nonionic surface active agent (surfactant) which not only serves to improve the mutual miscibility of the multiple ester additive and hydrocarbon components but also functions to facilitate the emulsification of the hydrocarbon component in the later water rinsing step. Examples of such compatibilizing surfactants are nonionic alcohol ethoxylates, where the alcohol is primary or secondary and has from 10 to 20 carbon units in the chain which can be linear or branched, and where the average number of ethoxylate groups is from 2 to 7.

Instead of a compatibilizing surfactant a compatibilizing solvent may also be used alone or in conjunction with the surfactant to further improve the mutual solubility of the cleaning composition blend, particularly where storage and handling at low temperatures are desirable. Examples of such compatibilizing solvents are long chain aliphatic alcohols and monobasic esters, glycols and glycol ethers. Examples are 2-ethylhexanol, dipropylene glycol monomethyl ether and dipropylene glycol monomethyl ether acetate. The compatibilizing agents must be selected as to not result in a low flash point of the final cleaning composition blend. A combination of compatibilizing surfactant and compatibilizing solvent can be employed.

In the present invention it has been discovered that water in the cleaning composition serves to increase cleaning effectiveness, i.e., measured by reduction of ionic contamination. The concentration of water is not critical but generally will be in an amount not greater than 2% by weight of the composition. An example of a concentration of water is in the range from 0.2 to 0.5% by weight.

Alternatively the cleaning composition may be dispersed in water to form an emulsion of the cleaning composition. Such emulsions or dispersions may contain up to about 95 percent by weight of water and are particularly useful in ultrasonic cleaning and air-spray cleaning. Particularly preferred emulsions contain between 70 and 90 percent water.

In the present invention it has also been discovered that rosin in the cleaning composition serves to increase cleaning effectiveness, i.e., measured by reduction of ionic contamination. Rosin also improves water compatibility in the cleaning composition so that a higher concentration of water may be used before phase separation occurs. Such use of rosin improves cleaning effectiveness and storage stability of fresh cleaning solution. To achieve these improvements, up to about 10 weight % of rosin may be used. The rosin may be any of the known types used for flux, e.g., water white wood rosin and the like.

The concentration or ratio of multiple ester additive to hydrocarbon component is not considered critical and the percentage of the two components can vary with wide ranges, such as 5 to 50% multiple ester additive and typically 50 to 95% hydrocarbon component on the basis of combined weight of the two components only. Additionally a combination of esters can be employed.

The amount of compatibilizing agent is not critical provided it functions to increase the solubility of the multiple ester additive-hydrocarbon component combination. Generally the compatibilizing surfactant will not be employed in an amount greater than 15% by weight of the multiple ester additive-hydrocarbon component combination. Generally the compatibilizing solvent, if needed, can be used for example up to 10% by weight of the total composition or alternatively by weight of components (a), (b) and (c).

An important criteria in the present invention is a reduction of ionic contamination due to cleaning with a combination of a hydrocarbon component, a multiple ester additive and a compatibilizing agent. A preferred substrate for cleaning is a printed circuit board and more particularly a printed circuit board contaminated with rosin flux after soldering operation. A need for cleanliness on surfaces of the board becomes essential due to defects which can result either at the time of manufacture or subsequently in the use of such printed circuit boards. For example corrosion of the circuit board can occur due to contamination from an activated rosin flux.

In the cleaning operation the method of contact of the cleaning composition to the circuit board is not critical. A preferred method of application of the cleaning composition is by sub-surface liquid jet during immersion of the circuit board in the cleaning composition but other conventional contact operations can be employed including spraying and dipping processes. When the cleaning operation is carried out by dipping in an ultrasonic bath or by spraying in air, the use of a water emulsion of the cleaning composition of this invention is preferred. Elevated temperature of the cleaning composition is feasible, such as a temperature up to 90° C., but room temperature material may be directly applied.

After application of the liquid, preferably the substrate is rinsed with water such as deionized water. The rinse water may be heated to facilitate the rinsing efficiency. Other methods of removal include but are not limited to wiping with a cloth, an alcohol rinse, air drying and oven baking.

To illustrate the present invention the following examples are provided. All parts and percentages are by weight unless otherwise indicated.

EXAMPLE 1

Four gallons of a cleaning composition was prepared in a 5-gallon container. The cleaning composition contained 70.5 percent of high flash point paraffinic/napthenic hydrocarbon solvent, 20.0 percent acetyl tributyl citrate, and 9.5 percent of a non-ionic surfactant (aliphatic alcohol ethoxylate) designated Tergitol ® 15-S-3. Percentages were by weight.

The high flash point hydrocarbon solvent had the following characteristics:

| Boiling Range | 421–578° F. |
|---|---|
| Flash Point, Tag Closed Cup | 201° F. |
| Composition: | wt. % |
| Cycloparaffins | 55 |
| Isoparaffins | 37 |
| n-Paraffins | 8 |

This material was placed in a modified two-sump Branson vapor degreaser. One of the sumps in the vapor degreaser was modified to hold a three nozzle spray wand which was connected to a pump. The pump drew liquid from the sump and forced it through the nozzles into the sump. The nozzles produced a jet of liquid instead of a spray and the nozzles were immersed under the surface of the liquid in the sump. The parts to be cleaned were supported on locator pins approximately two inches beneath the nozzles. A heating element in the sump allowed the cleaning agent to be heated up to 165° F.

Circuit boards that are approximately 4"×4.5" containing 800 drilled, but unplated holes were used for the test. Such boards typically are very difficult to clean and are used to indicate any small changes for different cleaning compositions. These boards were precleaned in Freon ® SMT solvent and then an Omegameter ® 600 SMD to reduce initial ionics to 0.0 ug/in$^2$ prior to starting the test.

During the test, 0.6–0.8 gm of Kester ® 1585 MIL flux was applied to each board. The boards were then run through an Electrovert Omegawave ® Wave Soldering unit at 6 feet per minute with the preheat at 500° C. and the solder at 250° C. After soldering, the boards were cleaned with the cleaner formulation to be tested in the modified Branson ® unit for three minutes at 125° F. Then the boards were transferred to an Electronic Controls Design Aqueous Washer and rinsed for one 3-minute cycle and three 1-minute cycles with 60° C. deionized water. The boards were then dried in an oven at 90° C. for 20 minutes.

The ionic contamination for each board was measured in the Omegameter ® 600 SMD using a 15 minute cycle time and at a temperature of 110° to 115° F. Five boards were measured under each set of test conditions and the mean and standard deviation was calculated for each test condition. The results for the formulation above indicated ionics having a mean of 16.6 ug/in$^2$ with a standard deviation of 1.9 ug/in$^2$. In comparison, a similar set of boards were processed but were conventionally cleaned using Freon ® TMS solvent in a Finishing Equipment vapor degreaser. The boards from this control process produced ionics having a mean of 3.7 ug/in$^2$ with a standard deviation of 2.4 ug/in$^2$ which is significantly higher than the ionics for the above formulation.

EXAMPLE 2

A bath of cleaning composition was prepared and boards were processed and tested as described in Example 1 except that the cleaning composition additionally contained 0.5 percent by weight water. The results for this formulation above indicated ionics having a mean of 9.7 ug/in$^2$ with a standard deviation of 1.0 ug/in$^2$ which was an improvement over the waterless formulation of Example 1 which had a mean of 16.6 ug/in$^2$ with a standard deviation of 1.9 ug/in$^2$.

EXAMPLE 3

This example demonstrates the representative multibasic ester candidates and the results of laboratory screening evaluations on each when blended in a cleaning formulation consisting of 73.0 weight percent high flash point aliphatic hydrocarbon, 9.5 percent nonionic surfactant and 17.5 percent multibasic ester. The hydrocarbon and nonionic surfactant components were the same as used in Example 1. The tests screened for: (1) mutual compatibility of the blend components; (2) rosin flux residue solubility, both solution rate and capacity to hold rosin; (3) emulsification with water and ease of separation of the water and organic phases; and (4) the analysis for undesired organic retained in the separated water phase. The representative multibasic esters and respective blend designation are:

| MULTIBASIC ESTER | BLEND |
| --- | --- |
| 1,2-Ethanediol diacetate | A |
| 1,5-Pentanediol diacetate | B |
| Triethyleneglycol diacetate | C |
| Tripropyleneglycol diacetate | D |
| Propyleneglycol divalerate | E |
| Acetyltributyl citrate | F |
| n-Butylbutyryl lactate | G |
| Dibutyl tartrate | H |
| Glycerine triacetate | I |

Testing blend compatibility was performed by visual observation of each blend in glass bottles at ambient temperature and when progressively cooled in a low temperature oil bath down to minus 20° C. The temperature at which phase separation, freezing or poor fluidity first occurred was recorded. The lower the temperature recorded the better the compatibility and handling characteristics of the cleaning formulation.

| BLEND | SEPARATION TEMP. °C. |
| --- | --- |
| A | >25 |
| B | −2 |
| C | >25 |
| D | −7 |
| E | <−20 |
| F | <−20 |
| G | <−20 |
| H | <−20 |
| I | >25 |

For the solubility tests a rosin flux residue was prepared by removing the solvent from 611F RMA Rosin Flux, product of Alpha Metals Inc., in a rotary vacuum evaporation apparatus and then heating the resultant residue at 205° to 210° C. in an open beaker for 30 minutes to simulate severe soldering conditions. On cooling the solid was ground to a fine powder. To 10.0 grams of each blend in a 70 mm high glass vial was added 0.5 grams of the rosin flux residue powder and the time for solution measured while shaking the stoppered vial. This procedure is repeated three more times with 1.5 gram additions each time. The latter additions are to test the flux loading capacity. Preferred blends are those with good solution rates on the first and second flux additions and with a capacity to dissolve all the flux additions.

| ROSIN FLUX SOLUBILITY IN 10 G. SOLVENT SECONDS TO DISSOLVE | | | | | |
| --- | --- | --- | --- | --- | --- |
| BLEND | FIRST 0.5 G | NEXT 1.5 G | NEXT 1.5 G | NEXT 1.5 G | ALL 5 G. SOLUBLE? |
| A | 50 | 130 | 210 | >300 | YES |
| B | 60 | 120 | >300 | >300 | YES |
| C | 30 | 60 | >300 | >300 | YES |
| D | 120 | 240 | >300 | >300 | YES |
| E | 95 | 240 | >300 | >300 | YES |
| F | 90 | 210 | 240 | 240 | YES |
| G | 105 | 150 | 210 | >300 | YES |
| H | 90 | 210 | >300 | >300 | YES |
| I | 90 | 65 | >300 | >300 | YES |

Emulsions were formed by placing 10.0 ml of the blend with 90.0 ml of water in a 100 ml graduated cylinder. The contents were equilibrated to 60° C. and then the stoppered graduate was inverted 30 times within a 30 second time period. The graduate was immediately placed in a 60° C. bath and the time for the emulsion to separate to a distinct interface at the 90 ml mark was noted. The presence of the multibasic ester should not adversely extend the separation time. All blends separated within one minute or less. The test was performed at 60° C. since the emulsion rinse and the decantation or separator device in actual cleaning equipment normally operate at that temperature.

After standing undisturbed for at least 2 hours the water phase of the above separated emulsions were carefully sampled for Chemical Oxygen Demand (COD) analysis using the Hach COD System for Waste Water Testing (Hach Company, Loveland, Colo.). Results are reported in milligrams COD per liter. Preferred multibasic ester candidates will, after water contact, transfer the least COD loading to the water.

| BLEND | EMULSION SEPARATION TIME MINUTES | WATER COD MG/LITER |
|---|---|---|
| A | <1 | >15,000 |
| B | <1 | >15,000 |
| C | 1 | >15,000 |
| D | 1 | >15,000 |
| E | 1 | 1,770 |
| F | 1 | 1,410 |
| G | <1 | 1,000 |
| H | <1 | 10,630 |
| I | <1 | >15,000 |

EXAMPLE 4

A steel ball bearing was packed with 1.10 grams of Shell Alvania Grease No. 2, a high-filler universal grease of No. 2 NLGI consistency. The ball bearing used was 1⅜ inches in outside diameter and contained a total of 22 balls, 3/16 inch in diameter in two races. A cleaning agent composition was prepared containing 85.5 percent of the high flash point paraffinic/napthenic hydrocarbon solvent of Example 1, 5.0 percent tributyl citrate, and 9.5 percent of a non-ionic surfactant designated Tergitol ® 15-S-3. Percentages were by weight. The bearing was suspended for 15 minutes in 600 ml of cleaning composition maintained at 50° C. and stirred by an agitator turning at 450 rpm in a 1000 ml beaker. The bearing was then suspended for two minutes in a 2000 ml beaker containing 1000 ml of distilled water maintained at 50° C. and stirred by an agitator turning at 450 rpm. The cleaned bearing was dried to constant weight in a vacuum oven at 130° C. In a separate experiment, the weight loss of the grease was found to be insignificant under these drying conditions. The final weight of the bearing was used to calculate the amount of grease remaining. The average grease removed in four replicate determinations, using identical bearings packed with 1.10 grams of the grease, was found to be 90.2 weight percent of the original grease present.

The experiment was repeated with identical bearings packed with 1.10 grams of the grease but using a second cleaning composition consisting of 85.5 percent of the same hydrocarbon solvent, 5.0 percent acetyl tributyl citrate, and 9.5 percent of the Tergitol ® 15-S-3. The average grease removed in duplicate determinations was found to be 74.5 weight percent of the original grease present.

Two ball bearings having the same external dimensions as those described above but containing 24 balls, 7/32 inch in diameter, were packed with 1.10 grams of the Alvania ® grease. One was cleaned by suspending in 1000 ml of boiling CFC-113 (trichlorotrifluoroethane) for 15 minutes and the other was cleaned by suspending in 2000 ml of boiling 1,1,1-trichloroethane for 15 minutes. After cleaning, the bearings were allowed to dry to constant weight in a laboratory hood. The final weights of the bearings indicated that 67.3 weight percent of the original grease was removed by the boiling CFC-113 and 86.4 weight percent was removed by the boiling 1,1,1-trichloroethane.

Therefore, the hydrocarbon-based cleaning compositions, when used in conjunction with a water rinse, are seen to be of the same order of effectiveness as CFC-113 and 1,1,1-trichloroethane for the removal of heavy grease from a ball bearing.

EXAMPLE 5

A small metal assembly was prepared by hand tightening three nuts, separated by three washers, on a ¼"×2" bolt. A cleaning agent composition was prepared containing 85.5 percent of the high flash point paraffinic/napthenic hydrocarbon solvent of Example 1, 5.0 percent tributyl citrate, and 9.5 percent of a non-ionic surfactant designated Tergitol 15-S-3. Percentages were by weight. The metal assembly was dipped for 15 seconds in Rust Lick "Cutzol" 711 cutting oil and allowed to drain for 15 seconds. The assembly was then suspended for one minute in 600 ml of room-temperature cleaning agent formulation stirred by an agitator turning at 450 rpm in a 1000-ml beaker. The assembly was then suspended for one minute in a 2000-ml beaker containing 1000 ml of distilled water maintained at 50° C. and stirred by an agitator turning at 450 rpm.

The cutting oil remaining on the assembly was extracted by loosening the nuts and immersing in 75.0 ml of CFC-113 for about an hour. A second extract was prepared by extracting a clean assembly that had been dipped in oil but not cleaned. A blank was prepared by extracting a clean assembly that had been subjected to the same cleaning agent and procedure. The percent oil remaining on the cleaned assembly was calculated by comparing the spectral absorbence, measured at 232 nm, of the extract from the cleaned assembly versus the spectral absorbence of the extract from the uncleaned assembly. The spectral absorbence of the blank was found to be insignificant. The average oil removed in replicate experiments with three assemblies was found to be 98.7 percent of the original oil present.

The experiment was repeated with identical assemblies dipped in the same oil but using a second cleaning composition consisting of 85.5 percent of the same hydrocarbon solvent, 5.0 percent acetyl tributyl citrate, and 9.5 percent of the Tergitol 15-S-3. The average oil removed in three replicate determinations was found to be 99.0 percent of the original oil present.

After dipping six more identical assemblies in oil, three were cleaned by suspending in 600 ml of boiling CFC-113 for one minute and three were cleaned in 600 ml of boiling 1,1,1-trichloroethane for one minute. After cleaning, the assemblies were allowed to dry in a laboratory hood and then subjected to the extraction procedure described above. The average oil removed by the CFC-113 was found to be 99.5 percent of the original oil present, and the average oil removed by the 1,1,1-trichloroethane was found to be 99.6 percent of the original oil present.

Therefore, the hydrocarbon-based cleaning compositions, when used in conjunction with a water rinse, are seen to be of the same order of effectiveness as CFC-113 and 1,1,1-trichloroethane for the removal of cutting oil from a metal assembly.

What is claimed is:

1. A cleaning composition suitable for cleaning a substrate which comprises:
   (a) a liquid hydrocarbon component;
   (b) a multiple ester additive having the formula:

$$(RO)_m\text{-A-}(CO_2\text{-R'})_n$$

wherein A is a linear, branched or cyclic alkane having 1 to 20 carbon atoms, or a di, tri, or tetra alkylene glycol wherein the alkylene contains 2 or 3 carbon atoms; m is an integer 1 to 6 and n is 0 or an integer 1 to 6; wherein when n is 0, then m is 2 to 6 and R is hydrogen or a linear, branched or cyclic alkyl carbonyl group having 1 to 20 carbon atoms; and when n is 1 to 6 and m is 1 to 6, then R' is a linear, branched or cyclic alkyl group having 1 to 20 carbon atoms; and then R is hydrogen or a linear, branched or cyclic alkyl carbonyl group having 1 to 20 carbon atoms; wherein the multiple ester additive contains at least two ester groups; and (c) a compatibilizing agent to improve mutual solubility of the hydrocarbon component and the multiple ester.

2. The cleaning composition of claim 1 wherein the hydrocarbon component is an aliphatic hydrocarbon liquid having a flashpoint greater than 140° F.

3. The cleaning composition of claim 2 wherein the hydrocarbon component is an aliphatic hydrocarbon liquid having a flashpoint greater than 200° F.

4. The cleaning composition of claim 2 wherein the aliphatic hydrocarbon liquid consists of cycloparaffins, isoparaffins, n-paraffins or mixtures thereof.

5. The cleaning composition of claim 1 wherein the compatibilizing agent is a non-ionic surfactant or dispersant.

6. The cleaning composition of claim 5 wherein the compatibilizing agent is an ethoxylated aliphatic alcohol.

7. The cleaning composition of claim 7 wherein the multiple ester additive is an alkanoic acid ester of a diol or triol compound.

8. The cleaning composition of claim 7 wherein the alkanoic acid is taken from the group consisting of formic acid, acetic acid, propionic acid, butyric acid, valeric acid and caproic acid.

9. The cleaning composition of claim 7 wherein the diol or triol compound is taken from the group consisting of 1,2-ethanediol, 1,2-propanediol, 1,4-butanediol, 1,5-pentanediol, 1,6-hexanediol, triethylene glycol, tetraethylene glycol, dipropylene glycol, tripropylene glycol; and glycerine.

10. The cleaning composition of claim 1 wherein the multiple ester additive is an alkanoic acid ester of a hydroxy alkanoate alkyl ester.

11. The cleaning composition of claim 10 wherein the alkanoic acid is taken from the group consisting of formic acid, acetic acid, propionic acid, butyric acid, valeric acid and caproic acid.

12. The cleaning composition of claim 10 wherein the hydroxy alkanoate alkyl ester is taken from the group consisting of hydroxy acetate, hydroxy propionate, hydroxy butyrate, hydroxy valerate and hydroxy caproate alkyl esters.

13. The cleaning composition of claim 12 wherein the alkyl is a linear, branched or cyclic aliphatic group having 1 to 20 carbon atoms.

14. The cleaning composition of claim 1 wherein the multiple ester additive is an alkyl ester of a compound containing at least two carboxylic acid groups and at least one hydroxyl group wherein the hydroxyl group is optionally esterified with a second alkanoic acid.

15. The cleaning composition of claim 14 wherein the alkyl is a linear, branched or cyclic aliphatic group having 1 to 20 carbon atoms.

16. The cleaning composition of claim 14 wherein the alkanoic acid is taken from the group consisting of formic acid, acetic acid, propionic acid, butyric acid, valeric acid and caproic acid.

17. The cleaning composition of claim 1 which contains (d) water.

18. The cleaning composition of claim 17 which contains up to 2% by weight water based on (a), (b), (c) and (d).

19. The cleaning composition of claim 1 which contains rosin.

20. The cleaning composition of claim 19 which contains rosin in an amount up to about 10% by weight of the cleaning composition.

21. A water emulsion or dispersion of a cleaning composition comprising:
(a) a liquid hydrocarbon component;
(b) a multiple ester additive having the formula:

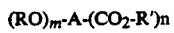

wherein A is a linear, branched or cyclic alkane having 1 to 20 carbon atoms, or a di, tri, or tetra alkylene glycol wherein the alkylene contains 2 or 3 carbon atoms; m is an integer 1 to 6 and n is 0 or an integer 1 to 6; wherein when n is 0, then m is 2 to 6 and R is hydrogen or a linear, branched or cyclic alkyl carbonyl group having 1 to 20 carbon atoms; and when n is 1 to 6 and m is 1 to 6, then R' is a linear, branched or cyclic alkyl group having 1 to 20 carbon atoms; and then R is hydrogen or a linear, branched or cyclic alkyl carbonyl group having 1 to 20 carbon atoms; wherein the multiple ester additive contains at least two ester groups; and (c) a compatibilizing agent to improve mutual solubility of the hydrocarbon component and the multiple ester; and (d) water.

22. The water emulsion or dispersion of claim 21 wherein the emulsion or dispersion contains up to 95 percent by weight of water.

23. The water emulsion or dispersion of claim 22 wherein the emulsion or dispersion contains between 70 and 90 percent water.

* * * * *